United States Patent
Jeong et al.

(10) Patent No.: US 10,461,778 B2
(45) Date of Patent: Oct. 29, 2019

(54) INTERLEAVING AND PUNCTURING APPARATUS AND METHOD THEREOF

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Hong-sil Jeong, Suwon-si (KR); Sang-hyo Kim, Seoul (KR); Kyung-joong Kim, Seoul (KR); Se-ho Myung, Yongin-si (KR); Jong-hwan Kim, Suwon-si (KR); Dae-hyun Ryu, Seongnam-si (KR); Min Jang, Seoul (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

(*) Notice: Subject to any disclaimer, the term of this patent is extended or adjusted under 35 U.S.C. 154(b) by 236 days.

(21) Appl. No.: 15/581,377

(22) Filed: Apr. 28, 2017

(65) Prior Publication Data

US 2017/0230063 A1    Aug. 10, 2017

Related U.S. Application Data

(63) Continuation of application No. 14/604,138, filed on Jan. 23, 2015, now Pat. No. 9,641,198.

(30) Foreign Application Priority Data

May 15, 2014  (KR) .......................... 10-2014-0058327

(51) Int. Cl.
    *H03M 13/27*     (2006.01)
    *H03M 13/13*     (2006.01)
    *H03M 13/00*     (2006.01)

(52) U.S. Cl.
    CPC ....... *H03M 13/2792* (2013.01); *H03M 13/13* (2013.01); *H03M 13/271* (2013.01); *H03M 13/6362* (2013.01)

(58) Field of Classification Search
    CPC .......... H03M 31/2792; H03M 13/005; H03M 13/13; H03M 13/271; H03M 13/6362
    See application file for complete search history.

(56) References Cited

U.S. PATENT DOCUMENTS 6,622,281 B1    9/2003    Yun et al.
7,586,993 B2    9/2009    Rastello et al.
(Continued)

OTHER PUBLICATIONS

Niu et al., Beyond turbo codes: Rate-compatible punctured polar codes, 2013 IEEE ICC Communication Theory, pp. 2423-2427.
(Continued)

*Primary Examiner* — Shelly A Chase
(74) *Attorney, Agent, or Firm* — Sughrue Mion, PLLC

(57) ABSTRACT

An apparatus and method for interleaving and puncturing are provided. The apparatus includes: an interleaver formed of a plurality of columns and rows, configured to perform interleaving by writing bits input to the interleaver in the plurality of columns and reading the bits from each row of the plurality of columns in which the bits are written; and a puncturer configured to puncture a predetermined number of bits among the bits read from the interleaver.

8 Claims, 14 Drawing Sheets

(56) References Cited

U.S. PATENT DOCUMENTS

| | | | |
|---|---|---|---|
| 8,392,673 B1* | 3/2013 | Sato | G11C 8/12 |
| | | | 711/157 |
| 2004/0168011 A1* | 8/2004 | Hemming | H03M 13/2771 |
| | | | 711/5 |
| 2005/0248473 A1* | 11/2005 | Kukla | H03M 13/271 |
| | | | 341/50 |

OTHER PUBLICATIONS

Nortel Networks, On the Algebraic Channel Interleaver Design, TSG-R1 4(99)466, 1999, (retrieved from google.com Jun. 28, 2016), pp. 1 to 21.

Nortel Networks, On the Algebraic Channel Interleaver Design, TSG R1 3(99)249, 1999, (retrieved from google.com Jun. 28, 2016), pp. 1 to 13.

* cited by examiner

FIG. 2A

BIT-REVERSAL RANGE

Input : (0,1,2,3) ⟶ (00,01,10,11) ⟶ (00,10,01,11) ⟶ Output : (0,2,1,3)

FIG. 2B

Input : (0,1,2,3,4,5,6,7) ⟶ (000,001,010,011,100,101,110,111)

↓ BIT-REVERSAL RANGE

Input : (0,4,2,6,1,5,3,7) ⟶ (000,100,010,110,001,101,011,111)

INTERLEAVING AND PUNCTURING APPARATUS AND METHOD THEREOF

CROSS-REFERENCE TO RELATED APPLICATION

This is a Continuation Application of U.S. application Ser. No. 14/604,138 filed Jan. 23, 2015, which claims priority from Korean Patent Application No. 10-2014-0058327, filed on May 15, 2014, in the Korean Intellectual Property Office, the disclosures of which are incorporated herein by reference in their entirety.

BACKGROUND

1. Field

Apparatuses and methods consistent with exemplary embodiments related to interleaving and puncturing bits of a transmission signal such as codeword bits.

2. Description of the Related Art

A polar code is an error correction code which is developed in 2009 by Arikan, and theoretically achieves a channel capacity at a binary-input discrete memoryless symmetric channel. However, there is a disadvantage in that when the polar code is designed as 2×2 kernel matrix, a length of the code is limited to power of 2.

The polar code is generated by a generated matrix G of K×N size generated based on a channel polarization phenomenon. Here, the matrix G is a matrix formed of binary values, that is $N=2^n$ (N is a natural number greater than 1), and K is a natural number not greater than N.

Accordingly, a polar codeword x corresponding to u which is a row vector of K length formed of binary values may be calculated as Equation 1 below.

$$u \cdot G = [u_0, u_1, \ldots, u_{K-1}] \cdot G = x = [x_0, x_1, \ldots, x_{N-1}] \qquad \text{[Equation 1]}$$

Here, an addition of the binary values is performed by an arithmetic operation, and the polar codeword becomes the row vector of K length formed of binary values. Here, according to a change of u value, a polar codeword x is also changed, and this mapping relation between u and x is called a polar code.

N length of the polar code is only a power value of 2, and thus, there is a problem that the length of the polar code is limited.

One of the methods which are used to resolve this problem is a puncturing method. A puncturing is one of the methods which are able to change a code length and a code rate variously, and is a method which does not transmit a part of bits constituting a codeword by removing the same. Here, a codeword before being punctured is called a mother code.

FIG. 1 illustrates an example of puncturing three bits (=p) regarding a polar codeword where K=4 and N=8.

Referring to FIG. 1, when a polar codeword x corresponding to u generated by a generator matrix G is formed of $x_0$, $x_1$, $x_2$, $x_3$, $x_4$, $x_5$, $x_6$, $x_7$ bits, if the $x_1$, $x_4$, $x_7$ bits are punctured, $x_0$, $x_2$, $x_3$, $x_5$, $x_6$ bit remain.

This puncturing method may be performed in a bit unit, and thus, every code length shorter than N may be made theoretically. Meanwhile, when puncturing is performed, various puncturing patterns may exist according to N and p. Even if a same number of bits are punctured, an error rate performance varies according to the puncturing pattern, and thus, it is important to decide which bit should be punctured.

SUMMARY

Various exemplary embodiments provide an interleaving and puncturing apparatuses and methods using an interleaver and a puncturer.

According to an aspect of an exemplary embodiment, there is provided an apparatus for interleaving and puncturing. The apparatus may include: an interleaver formed of a plurality of columns and rows, configured to perform interleaving by writing bits input to the interleaver in the plurality of columns and reading the bits from each row of the plurality of columns in which the bits are written; and a puncturer configured to puncture a predetermined number of bits among the bits read from the interleaver.

Here, the interleaver may successively write the input bits from a first row of a first column to a last row of a last column among the plurality of columns and rows in a column direction.

The interleaver may rearrange an order of the plurality of columns in which the bits are written, and successively read the bits written in each row of the plurality of columns of which the order is rearranged, in a row direction.

The puncturer may successively puncture the predetermined number of bits among the bits read from the interleaver.

The interleaver may read the bits written in the plurality of columns and rows differently depending on a number of the predetermined number of bits to be punctured.

Here, the number of the input bits may be $N=2^n$, the number of the plurality of columns may be $N_c=2^m$ ($1 \le m \le n-1$), the number of the plurality of rows may be $N_r=N/N_c$, a codeword to be designed from the input bits may have a length $L_i$, and the number of the predetermined number of bits to be punctured may be $p_i=N-L_i$. Then, if $p_i$ is greater than or equal to $2^m$, and is a power value of 2, the interleaver may read the bits written in the plurality of columns and rows successively from a first row to a last row of the plurality of columns in a row direction. However, if $p_i$ is less than $2^m$, or, if $p_i$ is greater than or equal to $2^m$, but is not a power value of 2, the interleaver may read the bits written in the plurality of columns and rows successively from the first row to a $(j-1)^{th}$ row of the plurality of columns, and then, read predetermined at least one bit written in a $j^{th}$ row of the plurality of columns, where $j = \lceil p_i / N_c \rceil$.

According to an aspect of another exemplary embodiment, there is provided a method of interleaving and puncturing. The method may include: performing interleaving by writing bits input to an apparatus for interleaving and puncturing in a plurality of columns and rows and reading the bits from each row of the plurality of columns which the bits are written; and puncturing a predetermined number of bits among the bits read from the interleaving.

Here, the writing may include successively writing the input bits from a first row of a first column to a last row of a last column among the plurality of columns and rows in a column direction.

The interleaving may include rearranging an order of the plurality of columns which the codeword bits are written, and the reading the bits may include successively reading the bits written in each row of the plurality of columns of which the order is rearranged, in a row direction.

The puncturing may include: successively puncturing the predetermined number of bits among the bits read from the interleaving.

According to the various exemplary embodiments, various puncturing patterns regarding polar code bits may be defined according to the configuration and the operation method of the apparatus for interleaving and puncturing.

BRIEF DESCRIPTION OF THE DRAWINGS

FIGS. 2A and 2B illustrate a method of generating a bit-reversal according to exemplary embodiments;

DETAILED DESCRIPTION OF THE EXEMPLARY EMBODIMENTS

Exemplary embodiments are described in greater detail with reference to the accompanying drawings.

According to an exemplary embodiment, there is provided a puncturing method for a polar code which may be referred to as a quasi-uniform puncturing technique. The quasi-uniform puncturing technique is a method of arranging indexes of a polar codeword bits in a bit-reversal order and then puncturing the codeword bits corresponding to the relevant indexes in order.

To perform the bit-reversal arranging, first of all, regarding a length of a code $N=2^n$, each of bit indexes of $0, 1, \ldots, N-1$ is represented as n bits. For example, an index 0 may be expressed as 00 . . . 0, an index 1 may be expressed as 00 . . . 1, . . . and an index N−1 may be expressed as 11 . . . 1. After rearranging the converted n bits of each index to be symmetrical to the n bits before this arrangement, the rearranged n bits are converted to a decimal number index.

As an example of the above method, a method of generating a bit-reversal regarding N=4 or N=8 is illustrated in FIGS. 2A and 2B, according to exemplary embodiments. FIG. 2A illustrates a method of generating a bit-reversal regarding N=4, and FIG. 2B illustrates a method of generating a bit-reversal regarding N=8.

After arranging bit indexes in a bit-reversal order regarding the length N as above, p number bits of the codeword are punctured in order from the front. For example, in case of FIG. 2A, if the quasi-uniform puncture is performed when N=4 and p=2, $x_0$ bit and $x_2$ bit may be punctured, and in case of FIG. 2B, if the quasi-uniform puncture is performed when N=8 and p=2, $x_0$ bit and $x_4$ bit may be punctured.

Meanwhile, the quasi-uniform puncture technique makes it possible to plan a polar code in various lengths, through a simple bit-reversal arrangement and a sequential puncture, but there is a problem that only one puncturing order is determined. That is, if one of an order of bits to be punctured is changed, the puncturing is performed by a different method.

Accordingly, another puncturing method is provided herebelow, according to an exemplary embodiment.

Figure 1:
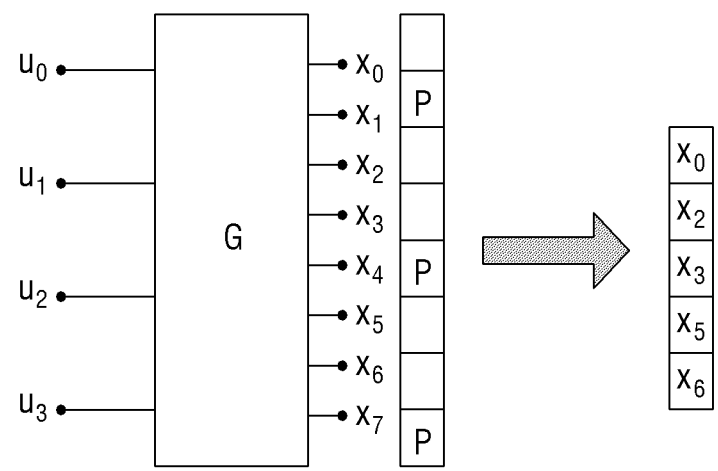
FIG. 1 is a view illustrating an example of performing a puncturing regarding a polar code.
Figure 3:
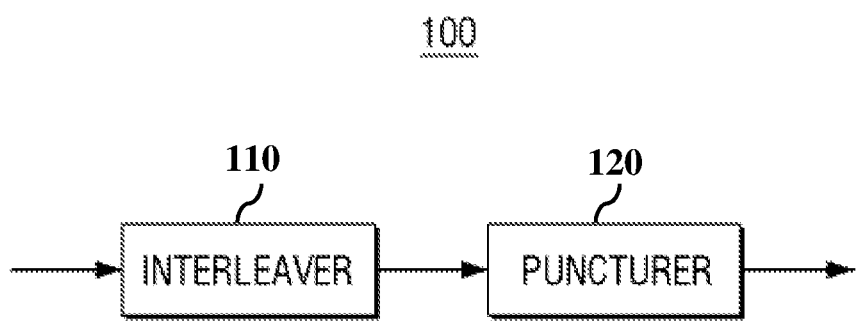
FIG. 3 is a block diagram explaining a configuration of an apparatus for interleaving and puncturing, according to an exemplary embodiment.

FIG. 3 is a block diagram explaining a configuration of an apparatus for interleaving and puncturing according to an exemplary embodiment. Referring to FIG. 3, an apparatus 100 for interleaving and puncturing includes an interleaver 110 and a puncturer 120.

The interleaver 110 performs interleaving regarding input codeword bits. For this, the interleaver 110 may be formed of a plurality of columns and rows to use these columns and rows for interleaving the input cordword bits.

In this case, the number of columns and rows of the interleaver 110 may be determined based on the number of the input codeword bits.

Figure 4:
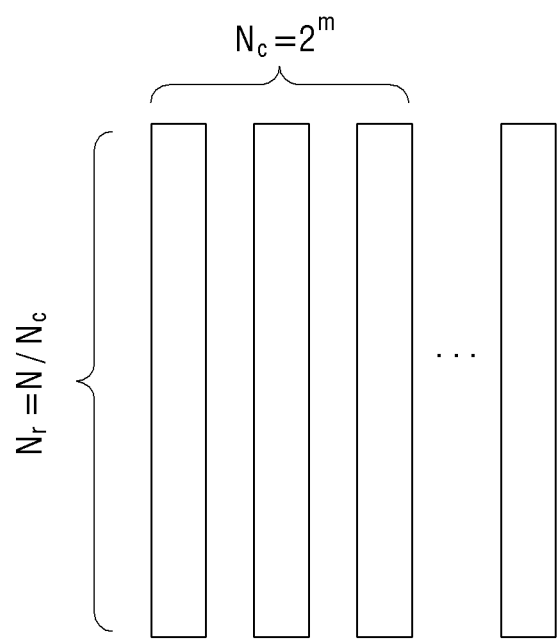
FIG. 4 is a view explaining a configuration of an interleaver according to an exemplary embodiment.

For example, the input bits may be $x=[x_0, x_1, \ldots, x_{N-1}]$ which are codeword bits of an $N=2^n$ bits generated by a polar code. In this case, as illustrated in FIG. 4, the interleaver 110 includes $N_c=2^m$ ($1 \leq m \leq n-1$) number of columns, and each column may be formed of $N_r=N/N_c$ number of rows.

If the interleaver 110 uses a plurality of columns and rows, the interleaver 110 may perform interleaving by writing the input codeword bits in the plurality of columns and reading the plurality of rows of the plurality of columns where the codeword bits are written. This is explained in detail in FIG. 5.

To be specific, the interleaver 110 may write input bits from a first row of a first column to a last row of a last column among the plurality of columns successively.

Figure 5A:
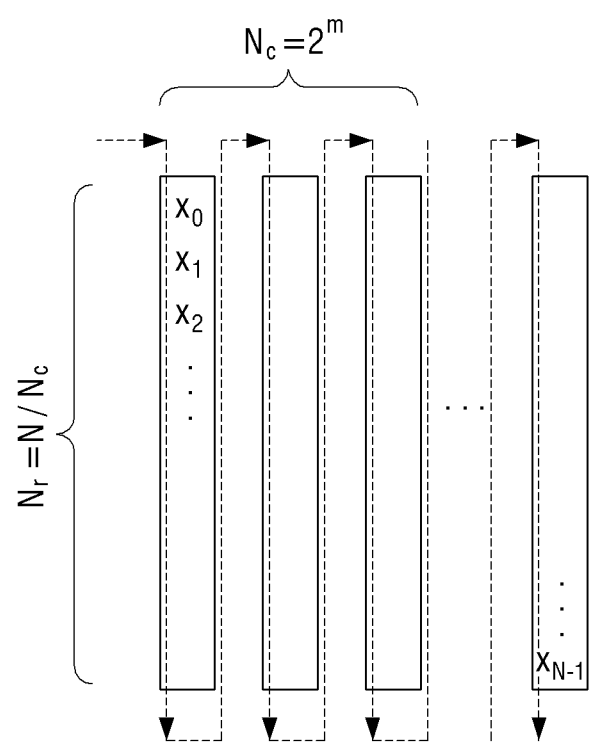
FIGS. 5A to 8 are views explaining interleaving operations, according to exemplary embodiments.

In other words, as illustrated in FIG. 5A, in response to input of codeword bits $x=[x_0, x_1, \ldots, x_{N-1}]$, the interleaver 110, by writing the $x_0$ bit in the first row of the first column, and by writing the $x_1, x_2, \ldots$ bits in a column direction from the next row, may write $N_c$ number of codeword bits in the first column successively.

Afterward, the interleaver 110 may write a bit next to the bit written in the last row of the first column such that the bit is written from a first row of a second column to the last row successively. Further, the interleaver 110, by repeating this operation to a third column, a fourth column, . . . , the last column, may write the input bits in each row of every column in a column direction.

In this manner, by writing the input bits from the first row to the last row of a column, and if the input bits are written in every row of the corresponding column, by writing the input bits from the first row to the last row of a next column, the interleaver 110 may write the input bits in each row of every column.

Afterward, the interleaver 110 may rearrange the order of the plurality of columns in which the codeword bits are written.

Figure 5B:
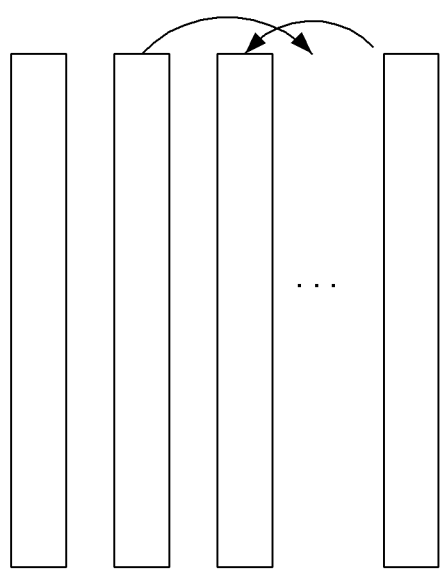

In this case, the interleaver 110 may rearrange the order of the plurality of columns in which the codeword bits are written through a bit-reversal as illustrated in FIG. 5B.

To be specific, the interleaver 110 may assign indexes 0, 1, . . . , $2^m-1$ to $2^m$ number of plurality of columns, respectively, represent the index assigned to each column as n bits, rearrange the n bits of each column to be symmetrical to the n bits before this arrangement, convert the symmetrically arranged bits to a decimal number index, and then rearrange an order of the plurality of columns according to the decimal number indexes.

For example, if the interleaver 110 uses four columns, indexes 0, 1, 2, 3 may be assigned from a first column to a fourth column, respectively, and the indexes may be expresses as 00, 01, 10, 11 bits, respectively. Accordingly, if bits corresponding to each column are rearranged so that the rearranged bits are symmetrical to the bits before the rearrangement, the rearranged bits become 00, 10, 01, 11, and if these bits are converted into decimal numbers, the rearranged bits become 0, 2, 1, 3. Accordingly, the interleaver 110 may rearrange the existing first column to be the first column, the existing second column to be the third column, the existing third column to be the second column and the existing fourth column to be the fourth column.

Meanwhile, the above example explains that after writing the codeword bits in the plurality of columns, the order of the plurality of columns in which the codeword bits are written is rearranged, but this is merely one of the examples.

According to another exemplary embodiment, information regarding a rearranging order according to the bit-reversal of the columns of the interleaver 110 may be pre-stored in the apparatus 100 for interleaving and puncturing. In this case, instead of writing the input bits in the plurality of columns successively and then rearranging the order of the plurality of columns which the bits are written according to the bit-reversal order, the interleaver 110 may write the input bits in the plurality of columns corresponding to the rearranging order according to the pre-stored information.

According to this exemplary embodiment, the interleaver 110 does not rearrange the order of the plurality of columns such that the existing first column in which the bits are written to be the first column, the existing second column in which the bits are written to be the third column, the existing third column in which the bits are written to be the second column, and the existing fourth column in which the bits are written to be the fourth column, but instead, the interleaver may write the input bits in a rearranged order of the first column, the third column, the second column and the fourth column of the interleaver 110.

After the input codeword bits are written according to either of the above two exemplary embodiments, the interleaver 110 may read the codeword bits written in each row of the plurality of columns successively.

Figure 5C:
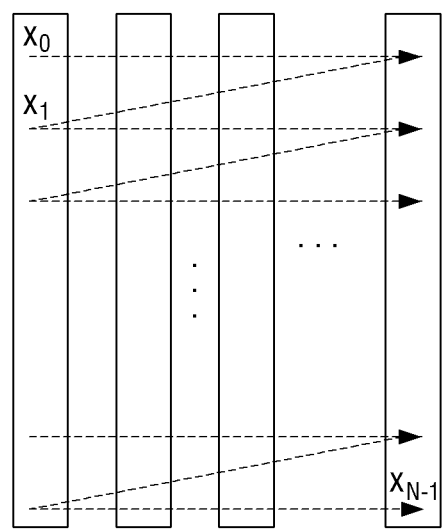

To be specific, as illustrated in FIG. 5C, the interleaver 110 may read bits written in a first row of every column in a row direction, read bits written in a second row of every column in a row direction, . . . , and read bits written in a last row of every column in a row direction.

Figure 6A:
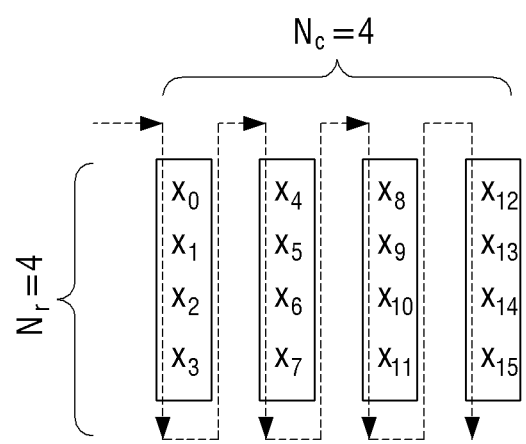
Figure 6B:
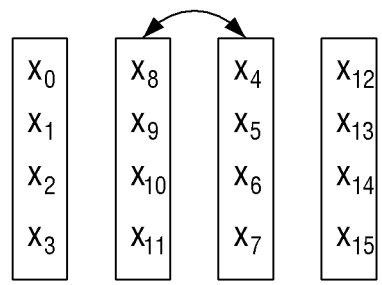
Figure 6C:
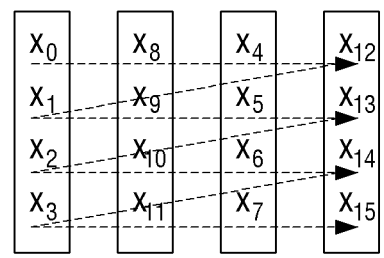

For example, as illustrated in FIG. 6A-6C, if codeword bits $x=[x_0, x_1, \ldots, x_{15}]$ are input to the interleaver 110, the interleaver 110 may perform interleaving using four columns formed of four rows, respectively. In other words, the interleaver 110 performs interleaving with respect to a case where $N=16$ and $N_c=4$.

First, as illustrated in FIG. 6A, the codeword bits $x=[x_0, x_1, \ldots, x_{15}]$ input to the interleaver 110 are written from a first column to a fourth column successively. Afterward, the order of the columns is rearranged by the bit-reversal order, and as illustrated in FIG. 6B, orders of an existing second column and an existing third column are changed. In other words, an existing first column is maintained as the first column, the existing second column is changed to the third column, the existing third column is changed to the second column, and an existing fourth column is maintained as the fourth column.

Afterward, as illustrated in FIG. 6C, in response to reading bits from a first row to a fourth row of the four columns, codeword bits which have an order such as $[x_0, x_8, x_4, x_{12}, x_1, x_9, x_5, x_{13}, x_2, x_{10}, x_6, x_{14}, x_3, x_{11}, x_7, x_{15}]$ may be output from the interleaver 110.

The puncturer 120 may puncture a predetermined number of bits among the bits output from the interleaver 110. Herein, the puncturing means not transmitting a part of the codeword bits by removing the part of the codeword bits, and the apparatus 100 for interleaving and puncturing may pre-store information regarding the number of bits to be punctured, and so on.

To be specific, the puncturer 120 may puncture the predetermined number of bits among the bits output from the interleaver 110 successively. In other words, the puncturer 120 may puncture the predetermined number of bits in an output order of the bits output from the interleaver 110.

For example, the codeword bits which have an order of $[x_0, x_8, x_4, x_{12}, x_1, x_9, x_5, x_{13}, x_2, x_{10}, x_6, x_{14}, x_3, x_{11}, x_7, x_{15}]$ are output from the interleaver 110 as described above, and p number of bits may be punctured. In this case, the puncturer 120 may puncture p number of bits from $x_0$ bit successively.

Accordingly, by puncturing a mother code which has a length of N, T numbers of polar codes which have different lengths may be designed. The length of a shortest codeword may be longer than N/2, and the length of T numbers of polar codes which are punctured $(L_1, L_2, \ldots, L_T)$ may be expressed by: $N/2<L_1<L_2<\ldots<L_T<N$.

As above, according to an exemplary embodiment, with respect to a feature of using an interleaver to puncture a polar code, various kinds of a puncturing pattern regarding a polar code may be defined according to a configuration and an operation method of the interleaver.

Meanwhile, the above example explains interleaving codeword bits through the interleaver 110 directly, but this is one of examples. The interleaver 110 may interleave indexes of the codeword bits, not the codeword bits themselves, and the puncturer 120 may puncture the codeword bits which have the indexes output from the interleaver 110 successively.

Also, in the above example, it is explained that the interleaver 110 reads the bits from a first row to a last row of a plurality of columns and outputs the bits written in the plurality of columns, but this is one of examples.

According to another exemplary embodiment, the apparatus 100 for interleaving and puncturing may be equipped with an additional memory depending on circumstances, and the interleaver 110 may perform a read operation using a memory (not illustrated) according to the number of punctured bits. In a case where the interleaver 110 performs the read operation using a memory (not illustrated) as above, the interleaver 110 may not perform an operation of rearranging an order of the plurality of columns.

To be specific, as an example, $p_i=N-L_i$ number of bits may be punctured to design a codeword of $L_i$ length.

In this case, if $p_i$ is greater than or equals to $2^m$, and is a power value of 2, the interleaver 110 may perform the read operation from a first row to a last row of a plurality of columns successively as described above.

However, if $p_i$ is less than $2^m$, or, if $p_i$ is greater than or equal to $2^m$, but is not a power value of 2, the interleaver 110 may perform the read operation using the memory (not illustrated). Hereinafter, a method of performing the read operation by the interleaver 110 using the memory (not illustrated) is described in detail.

First of all, $\lceil z \rceil$ is defined as an operator calculating a smallest integer which is greater than z, and mod(a, b) is defined as an operator calculating a remainder when a is divided by b.

In this case, when $j=\lceil p_i/N_c \rceil$, the interleaver performs reading from the first row successively until a j−1 number of rows. In other words, the interleaver 110, by reading codeword bits written in the first row of a plurality of columns which the codeword bits are written, by reading the codeword bits written in the second row of the plurality of columns, . . . , and by reading bits written in the $(j-1)^{th}$ row of the plurality of columns, may read bits written in each row from the first row to the $(j-1)^{th}$ row of the plurality of columns successively.

Afterward, the interleaver 110 may perform a read operation regarding the $j^{th}$ row using a memory (not illustrated) which stores information regarding the location of the column in which $mod(p_i, N_c)$ number of bits to be punctured are written.

For this, the information regarding the location of the column in which $\mathrm{mod}(p_i, N_c)$ number of bits to be punctured are written may be pre-stored in the memory (not illustrated).

In this case, the interleaver 110 may perform the reading from the column in which the bits to be punctured are written using the location information which was pre-stored while reading the $j^{th}$ row.

For example, N=16, $N_c$=4 and $p_i$=6. In this case, j=⌈6/4⌉=2, and mod(6, 4)=2.

Figure 7:
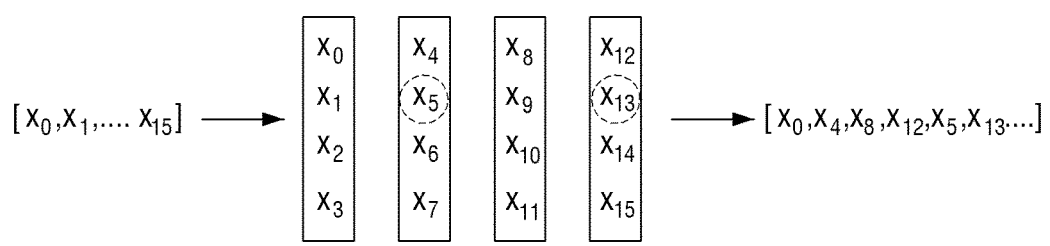

In this case, as illustrated in FIG. 7, the interleaver 110 may output $x_0$, $x_4$, $x_8$, $x_{12}$ by reading codeword bits written in a first row of four columns. Afterwards, the interleaver 110 may perform reading using information regarding a location pre-stored in a memory (not illustrated), while reading a second row.

For example, as information regarding a location of a column in which 2=mod(6, 4) number of bits to be punctured are written in the memory (not illustrated), when indexes 2, 4 of the column in which the bits to be punctured are written are pre-stored, the interleaver 110 may perform a reading from the column in which the bits to be punctured are written while reading the second row using the information regarding the pre-stored location. In other words, in the second row, the interleaver 110 may read $x_5$ written in the second column, may read $x_{13}$ written in the fourth column, and may read bits written in remaining columns successively.

Accordingly, bits may be output in the order of [$x_0$, $x_4$, $x_8$, $x_{12}$, $x_5$, $x_{13}$, . . . ], and finally, by the puncturer 120, $x_0$, $x_4$, $x_8$, $x_{12}$, $x_5$, $x_{13}$ may be punctured among the bits outputted from the interleaver 110.

As another example, in response to $\mathrm{mod}(p_i, N_c)$ number of bits to be punctured are written in columns adjoining each other, information regarding a location of a column in which one of bits to be punctured is written may be pre-stored.

In this case, the interleaver 110 may perform a reading operation from a column in which the bits to be punctured are written using the pre-stored location information while reading the $j^{th}$ row.

For example, N=16, $N_c$=4 and $p_i$=6. In this case, j=⌈6/4⌉=2, and mod(6, 4)=2.

Figure 8:
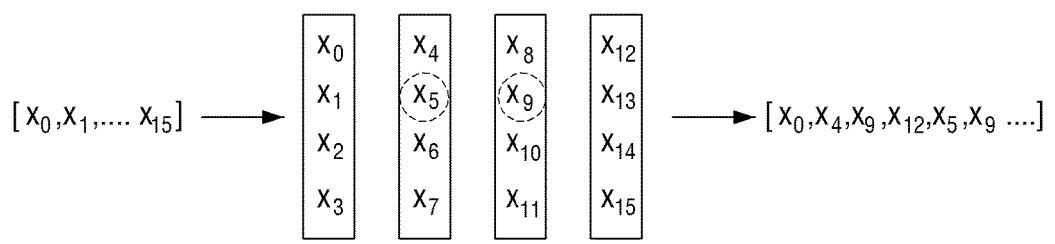

In this case, as illustrated in FIG. 8, the interleaver 110 may output $x_0$, $x_4$, $x_8$, $x_{12}$ by reading the codeword bits written in a first row of the four columns. Afterward, the interleaver 110 may perform a reading operation using the information regarding the location pre-stored in the memory (not illustrated) while reading the second row.

For example, as information regarding a location of a column in which 2=mod(6, 4) number of bits to be punctured are written in the memory (not illustrated), when index 2 of the column in which the bits to be punctured are written is pre-stored, the interleaver 110 may read two bits from the column in which the bits to be punctured are written using the information regarding the pre-stored location, while reading the second row.

In other words, in case of the second row, the interleaver 110 may read $x_5$ written in the second column, may read $x_5$ written in the 3rd column adjoining successively, and may read bits written in remaining columns successively.

Accordingly, bits may be outputted in the order of [$x_0$, $x_4$, $x_8$, $x_{12}$, $x_5$, $x_9$, . . . ] from the interleaver 110, and finally, by the puncturer 120, $x_0$, $x_4$, $x_5$, $x_{12}$, $x_5$, $x_9$ may be punctured among the bits output from the interleaver 110.

Meanwhile, in the above example, the interleaver 110 performing a reading operation by using the memory (not illustrated) is explained, but this is one of the examples. In other words, in response to indexes regarding bits to be punctured are pre-stored in the memory (not illustrated), the puncturer 120 may puncture the bits including the pre-stored indexes in the memory (not illustrated) among codeword bits output from the interleaver 110.

Figure 9:
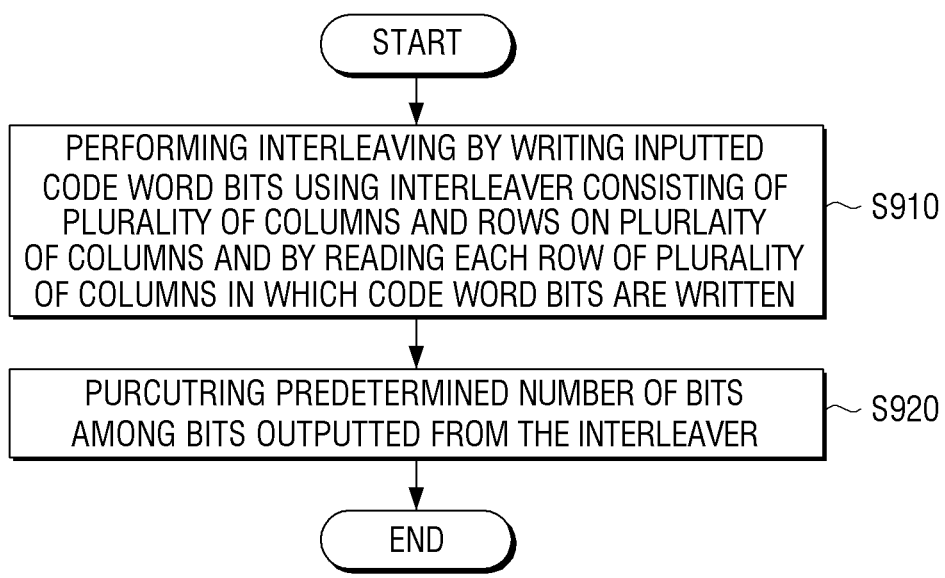
FIG. 9 is a flowchart explaining a method of interleaving and puncturing, according to an exemplary embodiment.

FIG. 9 is a flowchart explaining an interleaving and puncturing method according to an exemplary embodiment.

First, interleaving is performed by writing input codeword bits in a plurality of columns using an interleaver formed of a plurality of columns and rows, and by reading each row of the plurality of columns in which the codeword bits are written (S910).

To be specific, the codeword bits input from a first row of a first column to a last row of a last column among the plurality of columns may be written successively. After rearranging an order of the plurality of columns in which the codeword bits are written, the codeword bits written in each row of the plurality of rearranged columns may be read successively.

Afterward, a predetermined number of bits among the bits output from the interleaver is punctured (S920). In this case, the predetermined number of bits among the bits output from the interleaver may be punctured successively.

Meanwhile, a method of interleaving and puncturing the input codeword bits are explained in detail above.

A non-transitory computer readable medium storing a program which performs an interleaving and puncturing method successively according to the above exemplary embodiments may be provided.

A non-transitory readable medium means a medium which stores a data semi-permanently and is readable by an apparatus, not a media which stores a data for a short period such as a register, a cache, a memory and so on. Specifically, various applications or programs such as a compact disc (CD), a digital versatile disc (DVD), a hard disk, a Blu-ray disk, a universal serial bus (USB), a memory card and a read-only memory (ROM) may be stored and provided in a non-transitory readable medium.

The components, units or elements (hereafter collectively referred to as "elements") represented by a block as illustrated in FIG. 3 may be embodied as various numbers of hardware, software and/or firmware structures that execute respective functions described above, according to an exemplary embodiment. For example, these elements may use a direct circuit structure, such as a memory, a processor, a look-up table, etc. that may execute the respective functions through controls of one or more microprocessors or other control apparatuses. Also, these elements may be specifically embodied by a program or a part of code, which contains one or more executable instructions for performing specified logic functions. Also, at least one of these elements may further include a processor such as a central processing unit (CPU) that performs the respective functions, a microprocessor, or the like. Although a bus is not illustrated in the above block diagrams, communication between the respective blocks may be performed via the bus.

Various exemplary embodiments of the inventive concept have been illustrated and explained above, but the inventive concept is not limited to the exemplary embodiments. Also, the descriptions of the exemplary embodiments are intended to be illustrative, and not to limit the scope of the claims, and it would be appreciated by those skilled in the art that changes may be made to the exemplary embodiments without departing from the principles and spirit of the inventive concept, the scope of which is defined in the appended claims.

What is claimed is:

1. An apparatus comprising at least one processor to implement:
an interleaver configured to write bits in a plurality of columns, and read the written bits,
wherein the plurality of columns comprise a first column, a second column, and a third column, and
wherein the interleaver is configured to read the written bits by skipping a first bit written in a row of the first column and sequentially reading a second bit written in the row of the second column and a third bit written in the row of the third column.

2. The apparatus as claimed in claim 1, wherein the first bit and the second bit are bits written, respectively, in columns which are not adjacent to each other.

3. The apparatus as claimed in claim 1, wherein the interleaver is configured to read the third bit adjacent the first bit from the row and reads the second bit which is not adjacent to the third bit from the row without reading the first bit.

4. The apparatus as claimed in claim 1, further comprising:
a puncturer configured to puncture one or more bits of the read bits.

5. A method comprising:
writing bits in a plurality of columns; and
reading the written bits,
wherein the plurality of columns comprise a first column, a second column and a third column, and
wherein the reading reads the written bits by skipping a first bit written in a row of the first column and sequentially reading a second bit written in the row of the second column and a third bit written in the row of the third column.

6. The method as claimed in claim 5, wherein the first bit and the second bit are bits written, respectively, in columns which are not adjacent to each other.

7. The method as claimed in claim 5, wherein the reading reads the third bit adjacent the first bit from the row and reads the second bit which is not adjacent to the third bit from the row without reading the first bit.

8. The method as claimed in claim 5, further comprising:
puncturing at least one bit of the read bits.

* * * * *